United States Patent
Lin et al.

(10) Patent No.: US 6,229,732 B1
(45) Date of Patent: May 8, 2001

(54) REGULATED VOLTAGE SUPPLY CIRCUIT FOR INDUCING TUNNELING CURRENT IN FLOATING GATE MEMORY DEVICES

(75) Inventors: Yu-Shen Lin, Taipei; Tzeng-Huei Shiau, Hsin-Pu, both of (TW); Ray-Lin Wan, Fremont, CA (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/380,873

(22) PCT Filed: Sep. 3, 1998

(86) PCT No.: PCT/US98/18548

§ 371 Date: Sep. 9, 1999

§ 102(e) Date: Sep. 9, 1999

(87) PCT Pub. No.: WO00/14747

PCT Pub. Date: Mar. 16, 2000

(51) Int. Cl.[7] .................................................. G11C 16/04
(52) U.S. Cl. .............................. 365/185.18; 365/185.29; 365/189.11
(58) Field of Search ............................. 365/185.18, 226, 365/185.29, 189.11; 327/536

(56) References Cited

U.S. PATENT DOCUMENTS

| | | | |
|---|---|---|---|
| 5,077,691 | 12/1991 | Haddad et al. | 365/218 |
| 5,282,170 | 1/1994 | Van Buskirk et al. | 365/226 |
| 5,349,220 | 9/1994 | Hong | 257/322 |
| 5,406,524 | 4/1995 | Kawamura et al. | 365/226 |
| 5,581,107 | 12/1996 | Kawamura et al. | 257/392 |
| 5,612,921 | 3/1997 | Chang et al. | 365/226 |
| 5,659,502 | * 8/1997 | Sali et al. | 365/185.18 |
| 5,663,907 | 9/1997 | Frayer et al. | 365/185.16 |
| 5,687,117 | 11/1997 | Chevallier et al. | 365/185.12 |
| 5,721,707 | 2/1998 | Villa et al. | 365/218 |
| 5,754,476 | 5/1998 | Caser et al. | 365/185.29 |

OTHER PUBLICATIONS

"A 55ns 0.35um 5V–only 16M Flash Memory with Deep–Power–Down," Bhimachar Venkatesh et al., 1996 IEEE International Solid–State Circuits Conference / Session 2 / Flash Memory / Paper TP 2.7, pp.44–45.

* cited by examiner

Primary Examiner—Huan Hoang
(74) Attorney, Agent, or Firm—Mark A. Haynes; Haynes & Beffel LLP

(57) ABSTRACT

A circuit is provided for applying a negative voltage to the control gate of a floating gate memory cell and a positive voltage to the source drain or channel which comprises a positive voltage source to provide a positive voltage to the source of the cell, and a negative voltage source responsive to the supply voltage to provide a negative voltage to the control gate. A voltage regulator is included that is coupled to the negative voltage source and to the positive voltage source to maintain the negative voltage at a level responsive to the source voltage. The regulator maintains the negative voltage in response to the source voltage so that the electric field remains essentially constant over a range of values of source voltage.

14 Claims, 6 Drawing Sheets

NEGATIVE GATE SOURCE SIDE FN ERASE

REGULATED VOLTAGE SUPPLY CIRCUIT FOR INDUCING TUNNELING CURRENT IN FLOATING GATE MEMORY DEVICES

BACKGROUND OF THE INVENTION

1. Field of the Invention

The present invention relates to floating gate memory devices, and more particularly to circuits for generating a negative voltage to be applied to a control gate and a positive voltage to be applied to a source, a drain or a channel, in such a way that a constant electric field is maintained across the memory cell for inducing Fowler-Nordheim tunneling.

2. Description of Related Art

Flash memory devices are based on arrays of floating gate memory cells which are programmed in some cases by biasing the memory cells to induce hot electron injection into the floating gate increase the threshold of the memory cell. Also, in many examples the cells are erased by biasing the cells to induce Fowler-Nordheim tunneling of electrons out of the floating gate in order to establish a low threshold state. One common approach inducing Fowler-Nordheim tunneling for the erase operation is referred to as source side erase. According to this approach, a negative voltage is applied to the wordline of cells in the array to be erased, while a positive voltage or ground, is applied to the source. This biasing establishes an electric field between the floating gate and the source to induce Fowler-Nordheim tunneling. While the gate receives a negative voltage and the source receives a positive voltage or ground, the substrate is grounded and the drain is typically left floating. See U.S. Pat. No. 5,077,691; invented by Haddad, et al.; issued Dec. 31, 1991.

To support the source side erase operation, integrated circuits include a negative voltage charge pump or other source of negative voltage on the integrated circuit. In preferred systems, the voltage on the source side is as high as possible to reduce the magnitude of the negative voltage needed on the gate to establish sufficient electric field for tunneling. Also, it is known that a higher source voltage will induce higher band-to-band current on the source side and improve the efficiency of the tunneling. However, it is found that because of variations in the supply potential VDD of as much as 10% according to industry standards, and variations in current loading on the cells, the voltage applied to the source of a flash cell during source side erase cannot be maintained constant in many circumstances. As a result, the electric field across the floating gate and source will vary, and the erase time for cells can vary dramatically. There have been some attempts to regulate the negative voltage generation. See for example Venkatesh, et al., "A 55 ns 0.35 Micron 5V-Only 16 M Flash Memory With Deep-Power-Down" ISSCC 96/Session 2/Flash Memory/Paper TP2.7, pp. 44–45, 1996. However, it is desirable to provide an improved control over the erase time of flash memory cells, while maintaining the efficiency of the erasing operation.

SUMMARY OF THE INVENTION

According to the present invention, a circuit is provided for applying a negative voltage to the control gate of a floating gate memory cell and a positive voltage to a complementary node comprising the source, the drain or the channel, which comprises a positive voltage source that is responsive to a supply voltage to provide a positive voltage to the source (in a preferred embodiment) of the cell and a negative voltage source responsive to the supply voltage providing a negative voltage to the control gate. A voltage regulator is included that is coupled to the negative voltage source and to the positive voltage source to maintain the negative voltage at a level responsive to the positive voltage. The positive voltage and the negative voltage establish an electric field between the floating gate and the source (or other complementary node) of the memory cell to be erased. The regulator maintains the negative voltage in response to the positive voltage so that the electric field remains essentially constant over a range of values of the positive voltage, or alternatively maintains an essentially constant erase speed.

The electric field established between the floating gate and the source (or other complementary node) can be modeled by a physical relationship. The regulator according to one aspect of the invention, comprises a circuit that has a transfer function modeling the physical relationship to compensate for variations in the electric field over a range of values of voltage.

According to one aspect of the invention, the regulator comprises an amplifier that has a first input coupled to the positive voltage, a second input coupled to a reference potential, and an output coupled to the negative voltage source. Feedback is connected between the output of the negative voltage source and the second input to induce the output of the negative voltage source to track changes in the source voltage.

In one preferred aspect, the regulator comprises a level shift circuit coupled to the negative voltage generator, including for example a zener diode. A voltage divider is coupled between the level shift circuit and a reference potential and supplies a feedback voltage indicating variations in the negative voltage supplied by the negative voltage generator. A n-channel MOS transistor has a drain coupled to the supply voltage, a gate coupled to the positive voltage, and a source. A p-channel MOS transistor has a source coupled to the source of the n-channel MOS transistor, a gate coupled to the feedback voltage from the voltage divider, and a drain coupled to the negative voltage generator, through for example a level shifting circuit.

According to another aspect of the invention, a clamp circuit is coupled to the source of the n-channel MOS transistor to prevent the source of the n-channel MOS transistor from dropping below a clamp level.

The present invention can also be characterized as an integrated circuit memory comprising an array of floating gate memory cells, and circuits for reading, programming and erasing the memory cells in the array. According to this aspect of the invention, the circuit for erasing the memory cells in the array includes resources to apply a negative voltage to wordlines in the array and a positive voltage across the conductive paths to sources (or other complementary nodes) of memory cells in the array, and to maintain an essentially constant electric field across the floating gates and sources of memory cells in the array over a range of source voltages. The constant electric field according to a preferred aspect of the invention is maintained utilizing the voltage regulating technique discussed above.

The present invention thus provides a method for erasing floating gate memory cell based on applying a positive voltage to the source (or other complementary nodes) and applying a negative voltage to the control gate. In addition, the method involves regulating the negative voltage to maintain the negative voltage at a level responsive to the positive voltage on the source. The level responsive to the source voltage is regulated so that the electric field remains essentially constant between the floating gate and the source of the cell over a range of values of the source voltage. The regulating according to another aspect of the invention, the source voltage and a negative voltage establish an electric field between the floating gate and the source of the memory cell to be erased according to a physical relationship. The regulating of the negative voltage is accomplished by a circuit having a transfer function modeling the physical relationship.

In this manner, integrated circuit memory device having a constant erase speed can be provided. With a constant erase speed, the control circuitry for erasing the array of cells, can be improved.

Other aspects and advantages of the present invention can be seen upon review of the figures, the detailed description and the claims which follow.

DETAILED DESCRIPTION

Figure 1:
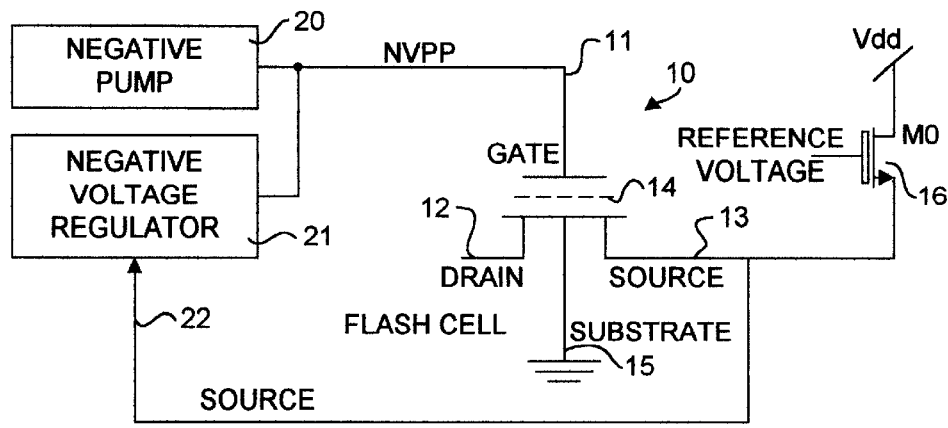
FIG. 1 is a simplified diagram illustrating the source side Fowler-Nordheim Tunneling erase operation according to the present invention with a negative voltage regulator which is responsive to the source voltage.

A detailed description of the present invention is provided with respect to FIGS. 1–9. In FIG. 1, a simplified diagram of a circuit according to the present invention is provided. As shown in FIG. 1, a flash memory cell 10 having a control gate on line 11, a drain on line 12, and a source on line 13 is provided. The floating gate cell 10 includes a floating gate 14. The cell 10 is coupled in this simplified example to a substrate represented by line 15 which is grounded for the erase operation. To induce erase, a source potential is applied to line 13 through transistor 16. The drain of transistor 16 is coupled to the supply potential VDD. The gate is coupled to a reference voltage which is used to establish the positive voltage on the source 13. Due to variations in VDD and other factors, the positive voltage on the source 13 can vary over a range of values.

During the source side erase, the drain terminal 12 is left floating, by disconnecting bitlines coupled to the drain. A negative voltage NVPP is applied to line 11. The negative voltage NVPP is generated by a charge pump 20 having a negative voltage regulator 21 coupled to it. The negative voltage charge pump 20 for one embodiment, is described in U.S. Pat. No. 5,532,906 entitled NEGATIVE VOLTAGE GENERATOR FOR FLASH EEPROM, issued Jul. 2, 1996. According to the present invention, the source voltage 13 is coupled to the negative voltage regulator 21 as indicated by line 22. The negative voltage regulator is responsive to the source voltage to control the output of the negative voltage generator 20 so as to maintain a constant erase speed, or alternatively, to maintain a constant electric field between the floating gate 14 and the source 13.

The electrical field between the floating gate and the source during erase can be expressed according to a physical relationship as follows:

$$\text{E-Field} = [V(\text{source}) - V(\text{floating gate})]/\text{oxide thickness}$$

$$= [Vs - (Cd^*Vd + Cg^*Vg + Cs^*Vs + Cb^*Vb + Q_f) + V_{FB}]/\text{oxide thickness}$$

$$= [(1-Cs)^*Vs - Cg^*Vg - Q_f - V_{FB})]/\text{oxide thickness} \quad \text{(equation 1)}$$

where

Cd: drain coupling ratio

Cg: gate coupling ratio

Cs: source coupling ratio

Cb: substrate coupling ratio $Q_f$: charge in the floating gate

Vd: drain voltage (=0V)

Vs: source voltage

Vg: gate voltage

Vb: substrate voltage (=0V)

$V_{FB}$: flat band voltage

To maintain a constant erase speed, this field should be a constant for typical floating gate cells or otherwise controlled. Thus the relationship between the gate voltage and source voltage can be defined. Equation 2 shows the relationship.

$$Vg = ((1-Cs)/Cg)^*Vs - (\text{E-field}^*\text{oxide thickness})/Cg + V_{FB}/Cg \quad \text{(equation 2)}$$

In this equation, the effect of charge in the floating gate is neglected.

Thus, source voltage is desired to be as high as possible to reduce the amount of negative voltage required to be generated by the on-chip negative voltage generator. Although, higher source voltage is undesirable because it induces a higher band-to-band current on the source side. By compromising the negative voltage magnitude, the area and efficiency of the negative voltage charge pump can be optimized. This relationship would be modified for channel erase, or drain-side erase, as appropriate.

Figure 2:
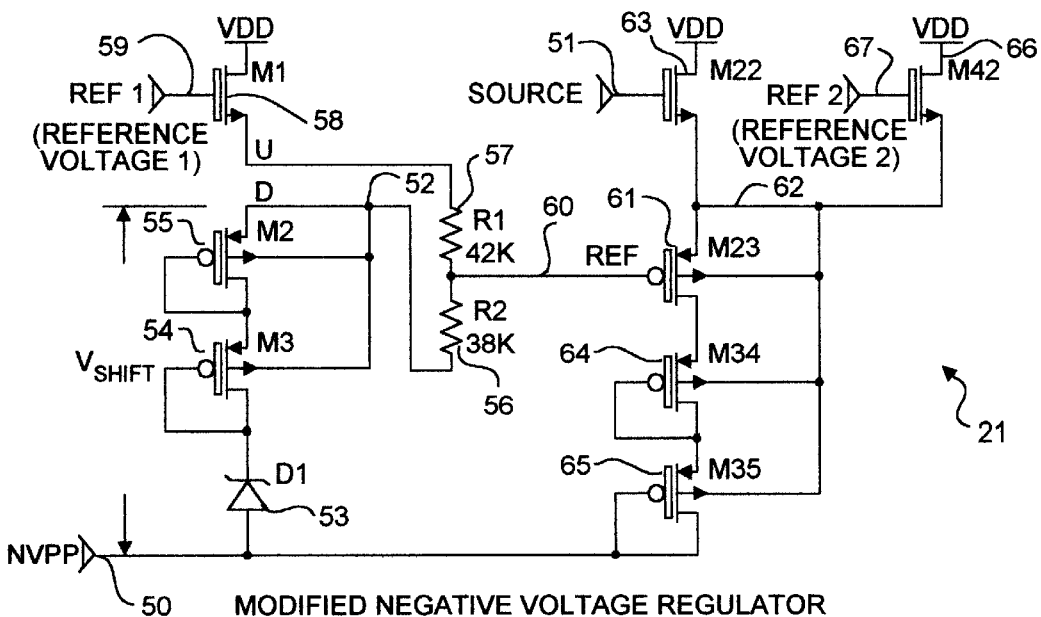
FIG. 2 is a circuit diagram of a preferred embodiment of the negative voltage regulator of FIG. 1.

FIG. 2 is a circuit diagram of a preferred negative voltage regulator 21 according to the present invention. The negative voltage regulator is coupled to the output NVPP of the negative pump on line 50. The source voltage generated by the source voltage source is supplied on line 51. A level shift circuit which induces a voltage shift $V_{SHIFT}$ is coupled from line 50 to node 52 at which a voltage $V_D$ is created. The level shift circuit comprises a zener diode 53, a first p-channel MOS transistor 54 and a second p-channel MOS transistor 55 in series. The transistors 54 and 55 have their respective gates coupled to their respective drains in diode configurations. The n-wells in which the transistors 54 and 55 are implemented are each coupled to the source of transistor 55 at node 52. In the preferred embodiment, transistor 54 is a native mode device in which the channel is doped with a lesser doping concentration to induce a lower threshold voltage. Both transistors 54 and 55 having channels that are 30 microns wide and 1 micron long in this example.

Node 52 is coupled to a voltage divider including resistor 56 and resistor 57. In this example resistor 56 has 38 kilohms of resistance, and resistor 57 has 42 kilohms. Resistor 57 is coupled to the source of n-channel transistor 58. The gate of transistor 58 is coupled to a reference voltage 59. The drain of transistor 58 is coupled to the supply potential VDD. In this example circuit, the reference voltage 59 is about 4.2 volts causing the voltage Vu at the source of transistor 58 to be about 4.2 volts less the threshold of transistor 58 of about 0.7 volts, or about 3.5 volts in this example. Because transistor 58 is quite large (the channel is 30 microns wide by 0.6 microns long in this example), and the current through transistor 58 is relatively small (20 to 60 microamps in this example), the gate to source voltage threshold can be kept relatively constant.

At node 60 between resistors 56 and 57, a feedback potential $V_{REF}$ is generated.

The feedback potential VREF is applied to the gate of p-channel transistor 61. The source of p-channel transistor 61 is coupled to the node 62. Node 62 is coupled to the source of n-channel transistor 63. The source voltage 51 is coupled to the gate of transistor 63, and the drain of transistor 63 is coupled to the supply potential VDD. The drain of transistor 61 is coupled to the output of the negative voltage generator on line 50 through the diode connected transistors 64 and 65. Transistors 64 and 65 each have their gates coupled to their drains. They are connected in series as illustrated in the figure. The n-wells are each coupled to the node 62. Likewise, the n-well of transistor 61 is coupled to node 62.

In addition, a clamping transistor 66 has its source coupled to node 62, its drain coupled to the supply potential VDD and its gate coupled to a reference voltage on line 67, which in this example is about 4.0 volts.

The zener diode 53 and the transistors 54 and 55 constitute a level shifter which reflects the magnitude of the negative voltage at line 50 by a voltage closer to, or above, the ground potential on node 52. Transistor 58 provides a constant voltage at its source as a power supply for the level shifter. Voltage divider implemented by resistors 56 and 57 is used to model the coefficient of equation 2 set forth above.

Thus the transfer function of the circuit of FIG. 2 can be expressed as follows:

$$V_D = V_{NVPP} + V_{SHIFT} \quad \text{(equation 4)}$$

$$V_{REF} = (V_U - V_D)*R_2/(R_1+R_2) + V_D \quad \text{(equation 5)}$$

$$V_{SOURCE} = V_{REF} + V_{GS}(\text{trans. 63}) - V_{GS}(\text{trans. 61}) \quad \text{(equation 6)}$$

$R_1$=resistance of resistor 57
$R_2$=resistance of resistor 56

Substituting equations 4 and 5 into 6, results in the following:

$$V_{NVPP} = (R_1+R_2)/R_1 * V_{SOURCE} - [(R_1+R_2)/R_1 * V_{GS}(\text{trans. 63}) - (R_1+R_2)/R_1 * V_{GS}(\text{trans. 61}) + R_2/R_1 * V_U + V_{SHIFT})] \quad \text{(equation 7)}$$

The gate to source voltage $V_{GS}$ for both transistors 61 and 63 is relatively constant by implementing them with relatively large devices (200 microns wide by 1 micron long for each in this example). Also, voltage $V_U$ at the source of transistor 58 is relatively constant. Thus, equation 7 can be made to match equation 2 quite well with the proper choice of the ratio of the resistances in the voltage divider implemented by resistors 56 and 57. Thus, as the voltage at the source of the transistors falls, the gate voltage can be increased in magnitude to compensate. This maintains erase speed essentially constant for a preferred system. Other relations to maintain constant erase speed may be implemented on a particular flash memory system.

Transistor 66 provides additional protection. If the source voltage drops too much, transistor 66 will prevent node 50 from going below a limit which would cause stress on a circuitry in the device.

Figure 3:
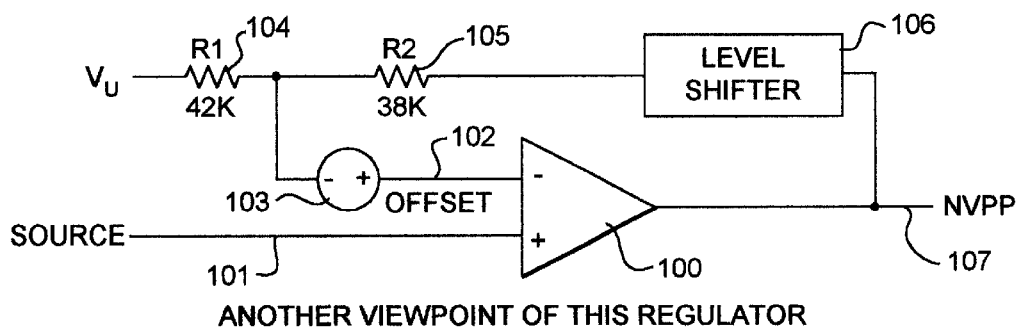
FIG. 3 illustrates an alternative view of a regulator according to the present invention.

FIG. 3 provides another point-of-view of the regulator 21. As can be seen in FIG. 3, the regulator includes an amplifier 100 having a positive input coupled to the source voltage on line 101, and a negative input 102 provided at the output of an offset generator 103. The input to the offset generator 103 is provided by the reference voltage $V_U$ across resistor 104, and by feedback provided through resistor 105 and level shifter 106 from the output on line 107, which is coupled to the output of the negative voltage generator.

The diagram of FIG. 3 is implemented in the circuit of FIG. 2 when the offset 103 is characterized as the threshold voltage of transistor 63 plus the absolute value of the threshold of the transistor 61. The resistors 104 and 105 adjust the feedback ratio. The voltage $V_U$ is utilized to adjust the output DC offset.

Other circuit designs may also be employed to model the physical relationship expressed in equation 2, or other physical relationship based on erase speed or electric field magnitude.

Figure 4:
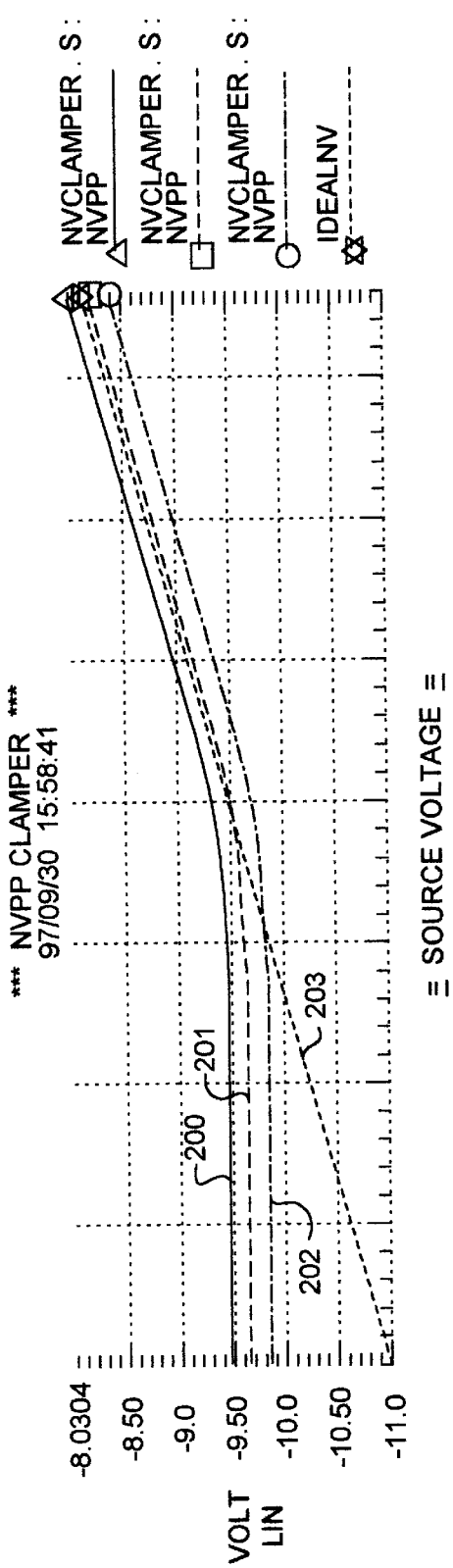
FIG. 4 is a graph of the output of the negative voltage generator versus source voltage according to a simulation of the circuit of FIG. 2.
Figure 5:
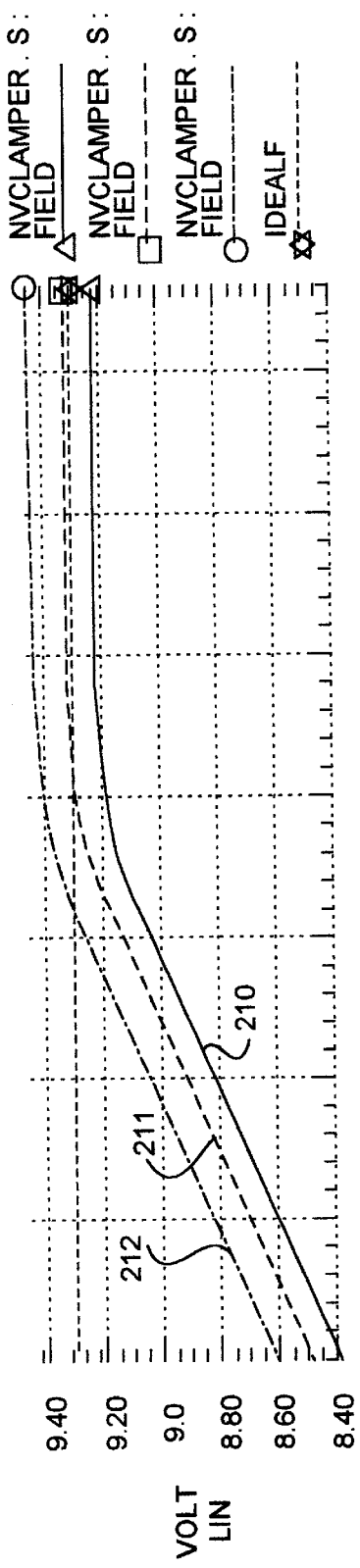
FIG. 5 is a graph of the magnitude of the electric field between the floating gate and source of the memory cell for a range of source voltages based on simulation of the circuit of FIG. 2.

FIGS. 4 and 5 illustrate the results of simulation of the circuit of FIG. 2. In FIG. 4, three cases are simulated. Trace 200 corresponds to a supply potential of 4.4 volts at 85° C., trace 201 corresponds to a supply potential of 5 volts at 25° C., and trace 202 corresponds to a supply potential of 5.6 volts at 0° C. The ideal curve is illustrated at line 203. As can be seen, the simulated results track the ideal curve quite well. In FIG. 4, for values of source voltage under about 4 volts, the circuit clamps the negative voltage at a constant value.

FIG. 5 illustrates simulation of the magnitude of the electric field over a range of source voltages for each of the three cases identified above. Thus, trace 210 corresponds to a supply potential of 4.4 volts at 85° C., case 211 corresponds to a supply potential of 5 volts at 25° C., and case 212 corresponds to a supply potential of 5.6 volts at 0° C.

As can be seen by review of FIG. 5, the electric field is essentially constant for a source voltage above 4 volts.

Figure 6:
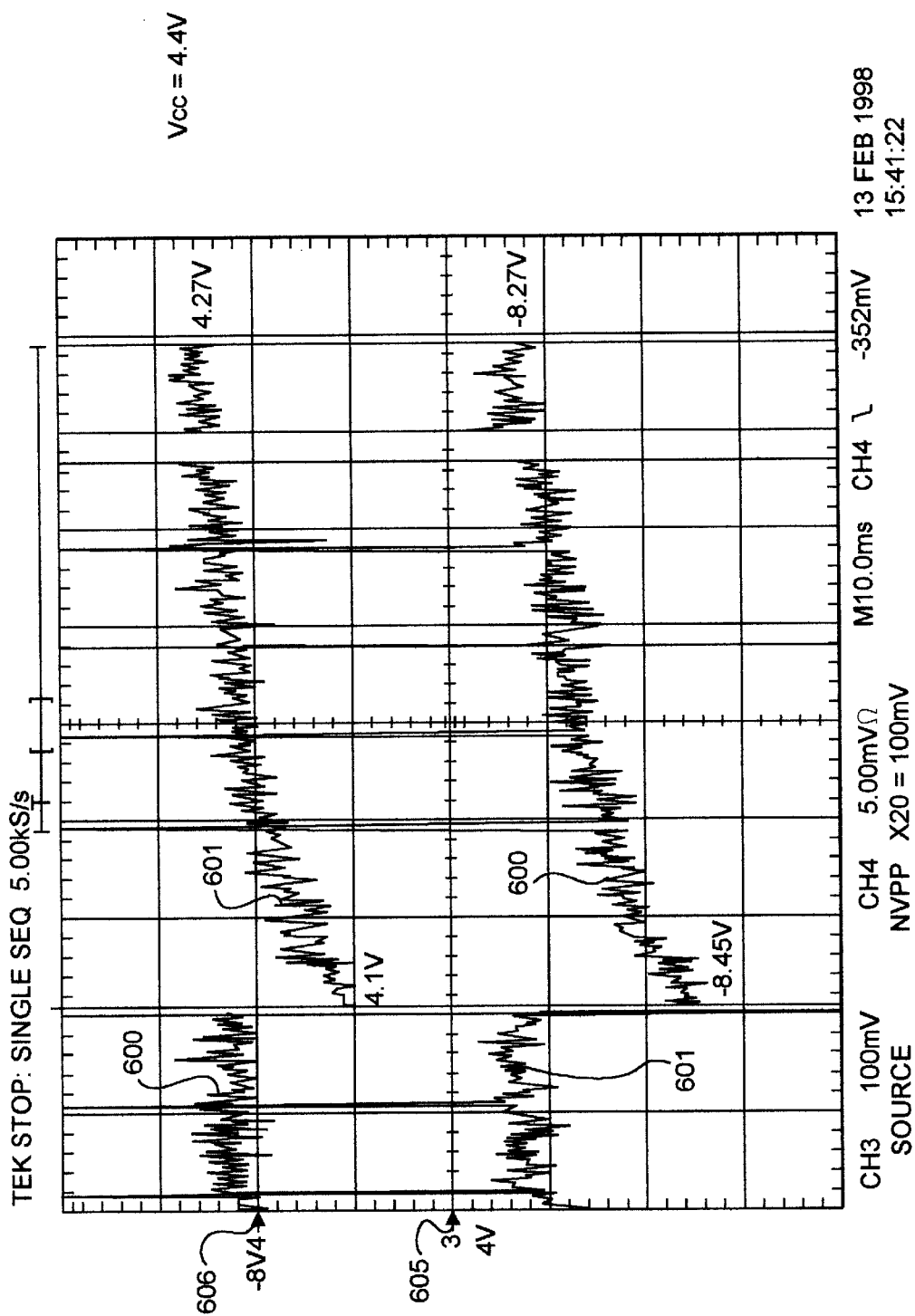
FIG. 6 illustrates the measured results of operation of an integrated circuit implementing the regulator of FIG. 2 for a supply potential of 4.4 volts.
Figure 7:
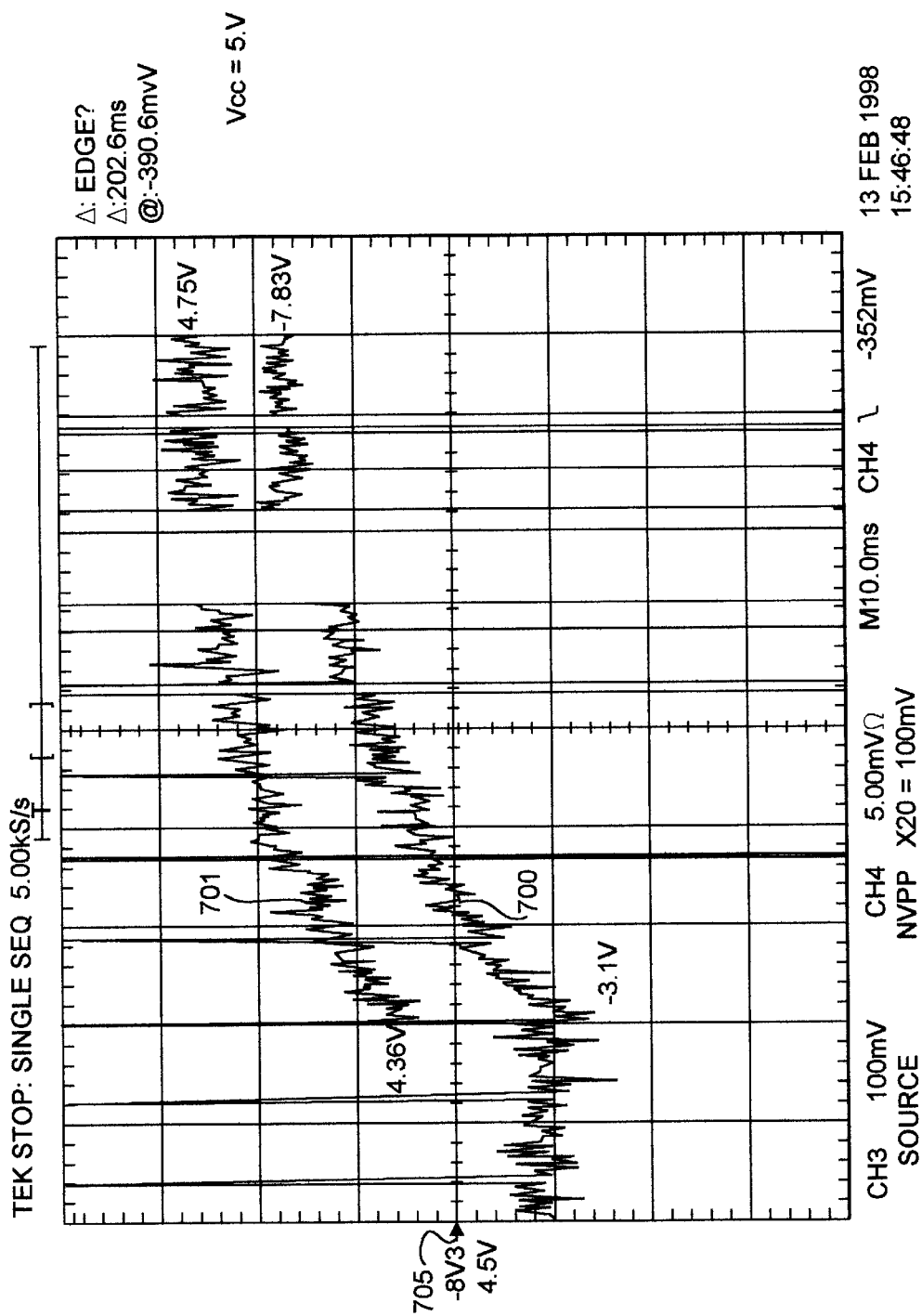
FIG. 7 illustrates the measured results of operation of an integrated circuit implementing the regulator of FIG. 2 for a supply potential of 5 volts.
Figure 8:
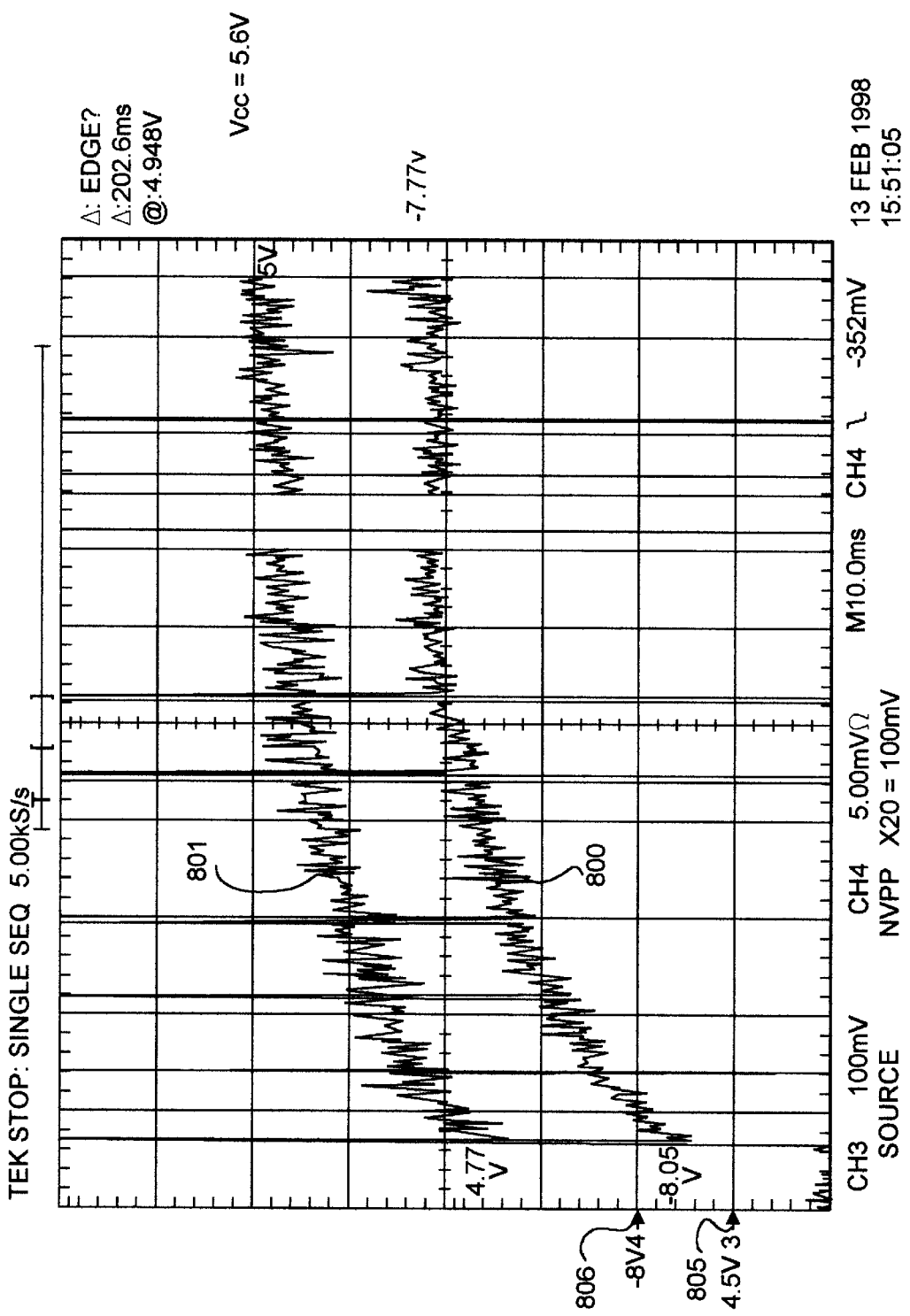
FIG. 8 Illustrates the measured results of operation of an integrated circuit implementing the regulator of FIG. 2 for a supply potential of 5.6 volts.

FIGS. 6, 7 and 8 illustrate measurement data for a circuit implemented according to FIG. 2. The negative voltage potential is graphed along trace 600 in FIG. 6, and the source voltage potential is graphed along trace 601. In FIG. 7, the negative voltage is shown on trace 700 and the source potential is shown on trace 701. In FIG. 8, the negative voltage is shown on trace 800, and the source potential is shown on trace 801.

In FIGS. 6, 7 and 8, horizontal axis represents time in 10 milliseconds per scale. The vertical axis represents the potential at the source and the output of ,the negative voltage generator. Thus, in FIG. 6, the line at point 605 represents an offset of 4 volts for the source potential. Line 606 represents an offset of about –8 volts for the negative voltage generator. In FIG. 7, line 705 represents 4.5 volts for the source potential and –8 volts for the negative voltage. In FIG. 8, line 805 represents 4.5 volts for the source voltage and line 806 represents –8 volts for the negative voltage.

Table 1 illustrates the results for FIGS. 6, 7 and 8 at the various supply potentials.

|  | Source | $\Delta V_{SOURCE}$ | NVPP | $\Delta V_{NVPP}$ | tracking ratio |
|---|---|---|---|---|---|
| Vdd = 4.4 v | 4.10 ~ 4.27 | 0.17 | −8.45 ~ −8.27 | 0.18 | 1.06 |
| Vdd = 5.0 v | 4.55 ~ 4.75 | 0.20 | −8.10 ~ −7.83 | 0.27 | 1.35 |
| Vdd = 5.6 v | 4.77 ~ 5.00 | 0.23 | −8.05 ~ −7.77 | 0.28 | 1.22 |

Note: tracking ratio ≡ $\Delta V_{NVPP}/\Delta V_{SOURCE}$

The non-constant tracking ratio reflected in the measurement data are believed to be due to the non-constant shifting voltage of the voltage shifter and poor regulation of the reference potentials in the tested circuit. However, as can be seen even in this implementation, the electric field can be maintained essentially constant and the erasing speed controlled using a circuit that manages the magnitude of the negative voltage applied to the control gate in response to variations in the source potential.

Figure 9:
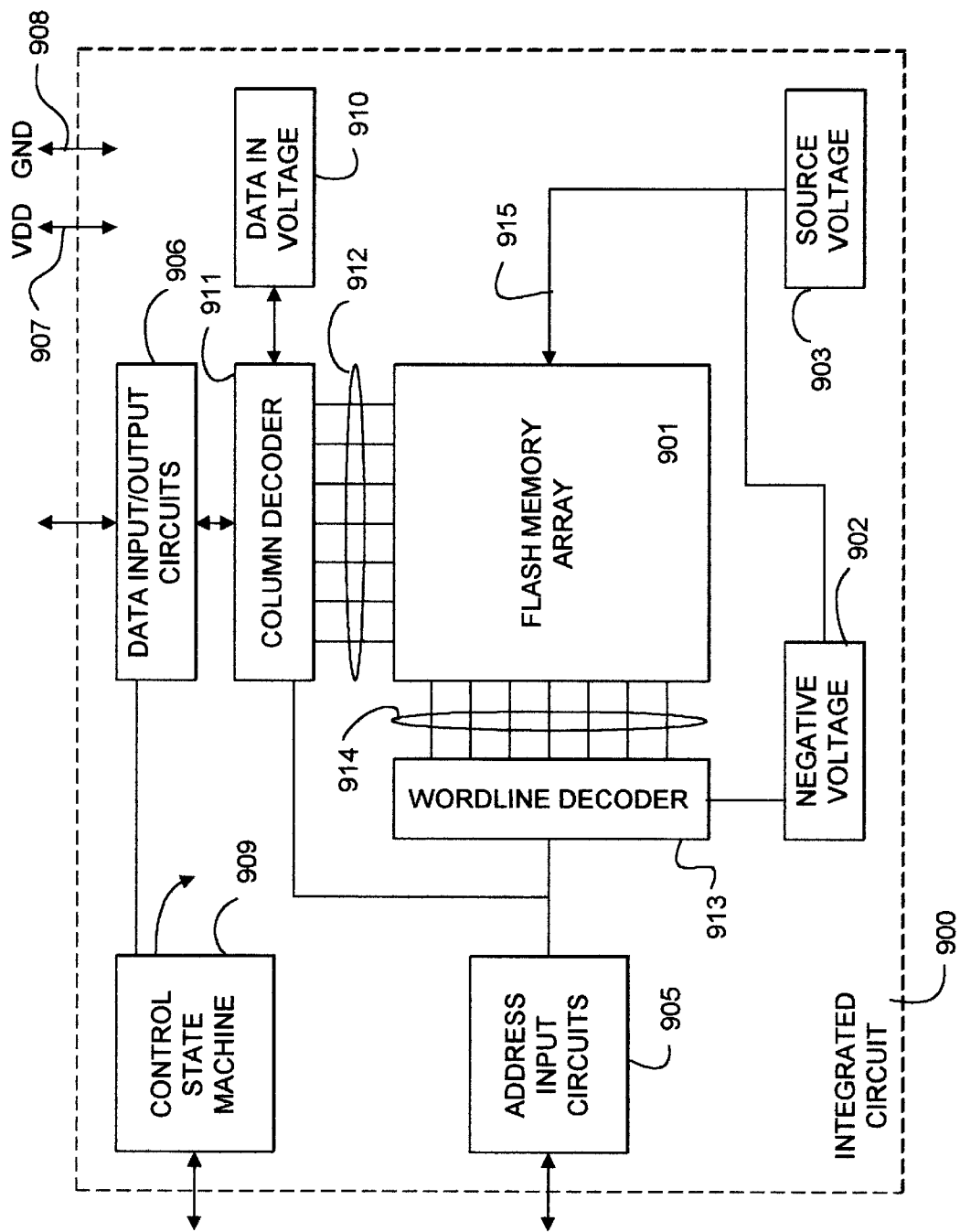
FIG. 9 is a simplified diagram of an integrated circuit memory implementing the regulated negative voltage generator of the present invention.

FIG. 9 is a simplified diagram of an integrated circuit 900 including a flash memory array 901. According to the present invention, a negative voltage generator 902 which is regulated in response to the voltage generated by a source voltage generator 903 is included for use during erasing of the array as described above.

Thus, the integrated circuit 900 includes address input circuits 905, data input/output circuits 906, a supply potential input 907, and a ground input 908. A control state machine 909 is coupled to the data input/output circuits 906 and the address input circuits 905 for managing the operation of the device for read, program and erase operations as known in the art. A data in voltage source 910 is coupled to a column decoder 911 and to the data input/output circuits 906 for applying voltages necessary for programming the array. The source voltage source 903 applies a voltage utilized for connection across source conductors to the sources of transistors in the array during the erase, program and read operations. The column decoder drives a set of bitlines 912 which are used to access memory cells in the array. A wordline decoder 913 is coupled to the array. The wordline decoder drives wordlines 914 which are used to access memory cells in the array.

The terminal 907 is coupled to a supply voltage VDD provided by a power supply (not shown) external to the circuit. This power supply voltage is specified typically to be about 5 volts +/−10%. In alternative systems, the supply voltage VDD may be specified at lower voltages, for example from 2.6 to about 3.2 volts, depending on the particular implementation. The data-in voltage generator 910, the source voltage generator 903, and the negative voltage generator 902 are all responsive to the supply voltage VDD to generate the potentials used during the read, program and erase operations. The erasing operations executed by the control state machine 909 are implemented for example as described in U.S. Pat. No. 5,414,664 entitled FLASH EEPROM WITH BLOCK ERASE FLAGS FOR OVERERASE PROTECTION, issued May 9, 1995.

During source side erase, a negative voltage is applied from the negative voltage generator 902 to wordlines of cells to be erased. At the same time, a positive voltage is applied from the source voltage source 903 to sources of transistors in the array as indicated by line 915. The negative voltage generator 902 includes a voltage regulator, as described above which maintains a constant erase speed, and supports a constant erasing time for memory cells in the array. This simplifies the control state machine 909, the algorithms which must be executed to erase the array, and in general allows for a faster, more reliable erasing algorithm.

Accordingly the present invention provides an improved technique for erasing memory cells in a floating gate memory device based on a source side erase operation. According to the present invention, a voltage regulator having a transfer function that models the physical relationship between source and wordline voltages, and the electric field between the floating gate and the source is provided. Thus, the output of the negative voltage generator driving the wordline is regulated in response to the source voltage to maintain such electric field in a manner that maintains the erasing speed constant during the erase operation. This provides for easier control of the erasing algorithms, and more efficient operation of the integrated circuitry.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. For a non-volatile memory cell having a control gate, a floating gate, a source, a drain and a channel, a circuit coupled to a power supply providing a supply voltage for applying a negative voltage to the control gate and a positive voltage to a complementary node comprising one of the drain, the source and the channel, comprising:

a positive voltage source responsive to the supply voltage providing a positive voltage to the complementary node;

a negative voltage source responsive to the supply voltage providing a negative voltage to the control gate;

a voltage regulator coupled to the negative voltage source and the positive voltage source to maintain the negative voltage at a level responsive to the positive voltage; and wherein the regulator comprises an amplifier having a first input, a second input, and an output, the first input coupled to the positive voltage, the second input coupled to a reference potential, and the output coupled to the negative voltage source, and including feedback connected between the output and the input.

2. The circuit of claim 1, wherein the positive voltage and the negative voltage establish an electric field between the floating gate and the complementary node, and the regulator maintains the negative voltage in response to the positive voltage so that the electric field remains essentially constant over a range of values of the positive voltage.

3. The circuit of claim 1, wherein the negative voltage source comprises a charge pump.

4. The circuit of claim 1, wherein the positive voltage and the negative voltage establish an electric field between the floating gate and the complementary node according to a physical relationship, and the regulator comprises a circuit having a transfer function modeling the physical relationship to compensate for variations in the electric field over a range of values of the positive voltage.

5. For a non-volatile memory cell having a control gate, a floating gate, a source, a drain and a channel, a circuit coupled to a power supply providing a supply voltage for applying a negative voltage to the control gate and a positive voltage to a complementary node comprising one of the drain, the source and the channel, comprising:

a positive voltage source responsive to the supply voltage providing a positive voltage to the complementary node;

a negative voltage source responsive to the supply voltage providing a negative voltage to the control gate;

a voltage regulator coupled to the negative voltage source and the positive voltage source to maintain the negative voltage at a level responsive to the positive voltage; and wherein the regulator comprises:

a level shift circuit coupled to the negative voltage generator;

a voltage divider coupled between the level shift circuit and a reference potential, and supplying a feedback voltage;

an n-channel MOS transistor having a drain coupled to the supply voltage, a gate coupled to the positive voltage, and a source;

a p-channel MOS transistor having a source coupled to the source of the n-channel MOS transistor, a gate coupled to the feedback voltage; and a drain coupled to the negative voltage generator.

6. The circuit of claim 5, including level shifting circuit coupling the drain of the p-channel MOS transistor to the negative voltage generator.

7. The circuit of claim 6, wherein the level shift circuit comprises a zener diode.

8. The circuit of claim 5, including a clamp circuit coupled to the source of the n-channel MOS transistor, to prevent the source of the n-channel MOS transistor from dropping below a clamp level.

9. An integrated circuit memory device on a single semiconductor substrate, comprising:

an array of floating gate memory cells having respective control gates, drains, sources and channels, the array having wordlines selectively coupled to control gates of memory cells in the array, and conductive paths selectively coupled to drains of memory cells in the array and to sources of memory cells in the array; and circuits for reading, programming and erasing the memory cells in the array; wherein the circuit for erasing the memory cells in the array includes a charge pump to apply a negative voltage to wordlines in the array and a complementary voltage to a complementary node comprising one of the source, drain and channel of memory cells in the array, and resources to maintain an essentially constant electric field across floating gates and complementary nodes of memory cells in the array over a range of values of the complementary voltage; and wherein the resources comprise an amplifier having a first input, a second input, and an output, the first input coupled to the complementary voltage, the second input coupled to a reference potential, and the output coupled to the charge pump, and including feedback connected between the output and the input.

10. The integrated circuit of claim 9, wherein the complementary voltage and the negative voltage establish an electric field between the floating gate and the complementary node according to a physical relationship, and wherein the resources to maintain an essentially constant electric field across floating gates and complementary nodes of memory cells in the array over a range of values of the complementary voltage, comprise a circuit having a transfer function modeling the physical relationship to compensate for variations in the electric field over the range of values of the complementary voltage.

11. An integrated circuit memory device on a single semiconductor substrate, comprising:

an array of floating gate memory cells having respective control gates, drains, sources and channels, the array having wordlines selectively coupled to control gates of memory cells in the array, and conductive paths selectively coupled to drains of memory cells in the array and to sources of memory cells in the array; and circuits for reading, programming and erasing the memory cells in the array; wherein the circuit for erasing the memory cells in the array includes a charge pump to apply a negative voltage to wordlines in the array and a complementary voltage to a complementary node comprising one of the source, drain and channel of memory cells in the array, and resources to maintain an essentially constant electric field across floating gates and complementary nodes of memory cells in the array over a range of values of the complementary voltage, wherein the resources comprise:

a level shift circuit coupled to the charge pump;

a voltage divider coupled between the level shift circuit and a reference potential, and supplying a feedback voltage;

an n-channel MOS transistor having a drain coupled to a supply voltage, a gate coupled to the complementary voltage, and a source;

a p-channel MOS transistor having a source coupled to the source of the n-channel MOS transistor, a gate coupled to the feedback voltage; and a drain coupled to the charge pump.

12. The integrated circuit of claim 11, including a level shifting circuit coupling the drain of the p-channel MOS transistor to the charge pump.

13. The integrated circuit of claim 11, wherein the level shift circuit comprises a zener diode.

14. The integrated circuit of claim 11, including a clamp circuit coupled to the source of the n-channel MOS transistor, to prevent the source of the n-channel MOS transistor from dropping below a clamp level.

* * * * *